US012794474B2

(12) United States Patent
Takada

(10) Patent No.: US 12,794,474 B2
(45) Date of Patent: Nov. 10, 2026

(54) OUTPUT CONTROL CIRCUIT AND VOLTAGE OUTPUT CIRCUIT

(71) Applicant: ABLIC Inc., Nagano (JP)

(72) Inventor: Kosuke Takada, Nagano (JP)

(73) Assignee: ABLIC Inc., Nagano (JP)

( * ) Notice: Subject to any disclaimer, the term of this patent is extended or adjusted under 35 U.S.C. 154(b) by 0 days.

(21) Appl. No.: 19/071,697

(22) Filed: Mar. 5, 2025

(65) Prior Publication Data

US 2025/0300659 A1 Sep. 25, 2025

(30) Foreign Application Priority Data

Mar. 19, 2024 (JP) ................................ 2024-043524

(51) Int. Cl.

*H03K 19/0185* (2006.01)
*H03K 5/00* (2006.01)
*H03K 5/13* (2014.01)

(52) U.S. Cl.

CPC ....... *H03K 19/018521* (2013.01); *H03K 5/13* (2013.01); *H03K 2005/00195* (2013.01)

(58) Field of Classification Search

CPC ............. H03K 19/018521; H03K 5/13; H03K 2005/00195; H03K 19/018507; H03K 2217/0063; H03K 3/356113; H03K 19/017509; H03K 2217/0081; H03K 17/687; H03K 3/012; H03K 17/063; H03K 17/102; H03K 2217/0072; H03K 19/018528; H03K 19/0013; H03K 19/0185; H03K 17/6871; H03K 3/35613; H03K 3/356017; H03K 17/6872; H03K 3/356182; H03K 3/037; H03K 19/20; H03K 19/0016; H03K 17/162; H03K 19/00315; H03K 19/0175; H03K 17/693; H03K 17/567; H03K 17/04123; H03K 17/223; H03K 3/356104; H03K 17/08122; H03F 2200/451; H03F 3/195; H03F 3/245; H03F 3/211; H03F 1/0227; H03F 2200/387; H03F 2203/21106; H03F 3/72; H03F 3/19;

(Continued)

(56) References Cited

U.S. PATENT DOCUMENTS 6,586,974 B1 * 7/2003 Humphrey ..... H03K 19/018521 326/82
6,777,997 B2 * 8/2004 Tahara ............. H03K 19/01855 327/333

(Continued)

FOREIGN PATENT DOCUMENTS

JP 2023090037 6/2023

*Primary Examiner* — John W Poos
(74) *Attorney, Agent, or Firm* — JCIPRNET

(57) ABSTRACT

An output control circuit and a voltage output circuit are provided. The output control circuit includes: a first output terminal and a second output terminal connected to a first switch and a second switch respectively, an input terminal, a first level shift circuit, a delay circuit that outputs a signal received after a delay time set longer than a delay time of the first level shift circuit, a second level shift circuit that level-shifts a signal received by an input port connected to an output port of the delay circuit and outputs a level-shifted signal, and a control circuit that outputs a signal with a signal level determined to be either a first level or a second level based on signal levels of signals received from two input ports.

12 Claims, 7 Drawing Sheets

(58) Field of Classification Search
CPC ............... H03F 3/602; H03F 2200/336; H03F 2200/171; H03F 1/0277; H03F 3/45475; H03F 1/0261; H03F 2200/411; H03F 2200/537; H03F 2200/541; H03F 2200/534; H03F 2200/27; H03F 2200/414; H03F 2200/417; H03F 2200/504; H03F 2203/21142; H03F 2203/21157; H03F 3/21; H03F 2200/222; H03F 2200/318; H02M 1/08; H02M 3/158; H02M 3/07; H02M 3/1588; H02M 1/088; H02M 1/0009; H02M 3/155; H02M 3/1584; H02M 1/36; H02M 1/0006; H02M 3/156; H02M 3/157; H02M 1/38; H02M 1/0048; H02M 1/32; H02M 3/073; H02M 1/0058; H02M 7/5387; H02M 3/33523; H02M 3/01; H02M 1/0032; H02M 1/007; H02M 3/071; H02M 1/0025; H02M 1/0054; H02M 7/538; H02M 1/0045; H02M 3/33571
See application file for complete search history.

(56) References Cited

U.S. PATENT DOCUMENTS

| | | | | |
|---|---|---|---|---|
| 10,892,760 | B1 * | 1/2021 | Rao ................ | H03K 19/017509 |
| 2011/0234291 | A1 * | 9/2011 | Kuge ............. | H03K 19/018521 327/333 |
| 2023/0198401 | A1 | 6/2023 | Sumitomo | |
| 2024/0388292 | A1 * | 11/2024 | Lacombe ....... | H03K 19/018521 |

* cited by examiner

OUTPUT CONTROL CIRCUIT AND VOLTAGE OUTPUT CIRCUIT

CROSS-REFERENCE TO RELATED APPLICATION

This application claims the priority benefits of Japanese application no. 2024-043524, filed on Mar. 19, 2024. The entirety of the above-mentioned patent application is hereby incorporated by reference herein and made a part of this specification.

BACKGROUND

Technical Field

The present invention relates to an output control circuit and a voltage output circuit.

Description of Related Art

Generally, an output control circuit is used in the output portion of a voltage output circuit such as a switching regulator, and a dead time is provided to prevent through current from flowing through a high-side switch and a low-side switch connected in series (for example, refer to Japanese Patent Application Laid-Open Publication No. 2023-90037).

However, in conventional output control circuits, a level shift circuit may be necessary in the stage preceding the high-side switch or in the path of its control signal, and the minimum value of the dead time was limited due to the addition of the delay time of this level shift circuit.

SUMMARY

The present invention, considering the aforementioned circumstances, provides an output control circuit and a voltage output circuit that may shorten the dead time even while a level shift circuit exists in the stage preceding the high-side switch or in the path of its control signal.

An output control circuit according to an aspect of the present invention includes: a first output terminal and a second output terminal, connected respectively to a control port of a first switch and a control port of a second switch, the first switch and the second switch, including control ports, being connected in series to form a switch circuit; an input terminal; a first level shift circuit, including an input port connected to the input terminal and an output port level-shifting a signal received by the input port and outputting a level-shifted signal; a delay circuit, including an input port connected to the input terminal and a first output port connected to the second output terminal, the delay circuit outputting a signal received from the input port after a delay time set longer than a delay time of the first level shift circuit; a second level shift circuit, including an input port connected to an output port of the delay circuit and an output port level-shifting a signal received by the input port and outputting a level-shifted signal; and a control circuit, including a first input port connected to an output port of the first level shift circuit, a second input port connected to an output port of the second level shift circuit, and an output port connected to the first output terminal, the control circuit outputting a signal with a signal level determined to be either a first level or a second level based on signal levels of a signal received from the first input port and a signal received from the second input port.

According to the present invention, it is possible to shorten the dead time while including a level shift circuit exist in the stage preceding the high-side switch or in the path of its control signal.

DESCRIPTION OF THE EMBODIMENTS

The output control circuit and the voltage output circuit according to the embodiments of the present invention are described below based on the drawings.

First Embodiment

Figure 1:
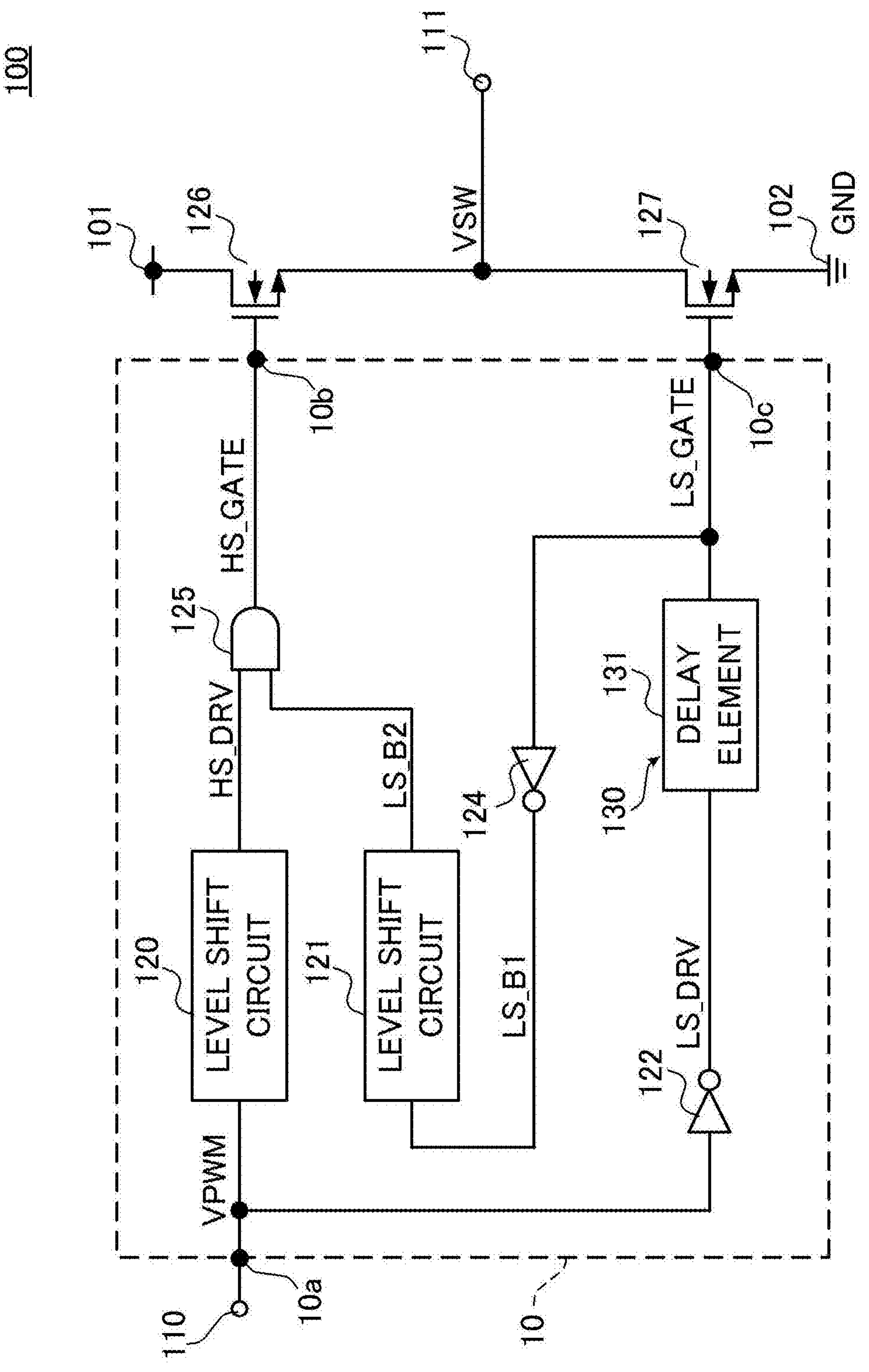
FIG. 1 is a circuit diagram illustrating a configuration example of an output control circuit and a voltage output circuit according to the first embodiment of the present invention.

FIG. 1 is a circuit diagram of an output control circuit 10 and a voltage output circuit 100 serving as examples of the output control circuit and the voltage output circuit, respectively, according to the first embodiment of the present invention.

The voltage output circuit 100 includes, for example, a power terminal 101, a ground terminal 102, an output control circuit 10, a switch 126 including a control port, a switch 127 including a control port, an input terminal 110, and an output terminal 111. The output control circuit 10 includes level shift circuits 120 and 121, inverters 122 and 124, a delay circuit 130 including a delay element 131, an AND circuit 125, an input port 10*a*, a first output port 10*b*, and a second output port 10*c*.

The input port 10*a*, which serves as the input terminal of the output control circuit 10, is connected to the input terminal 110, which is the input terminal of the voltage output circuit 100, and is a node identical to the input terminal 110. The first output port 10*b*, which serves as the first output terminal of the output control circuit 10, is connected to the control port of the switch 126, which serves as the first switch. The second output port 10*c*, which serves as the second output terminal of the output control circuit 10, is connected to the control port of the switch 127 serving as the second switch.

In the output control circuit 10, the level shift circuit 120 includes an input port connected to the input terminal 110 and an output port that outputs a level-shifted signal received by the input port. The inverter 122 includes an input port connected to the input terminal 110 and an output port that outputs a signal with inverted signal level of the signal received by the input port. The delay circuit 130, which is configured to include the delay element 131, includes an input port connected to the input terminal 110 via the inverter 122 and an output port including a first output port connected to the control port of the switch 127.

The inverter 124 includes an input port connected to the output port of the delay element 131 and an output port that outputs a signal with inverted signal level of the signal received by the input port. The level shift circuit 121 includes an input port connected to the output port of the delay element 131 via the inverter 124 and an output port that outputs a level-shifted signal received by the input port. The AND circuit 125, serving as a control circuit, includes a first input port connected to the output port of the level shift circuit 120, a second input port connected to the output port of the level shift circuit 121, and an output port connected to the control port of the switch 126.

The switch 126 contains a drain connected to the power terminal 101, a gate serving as the control port connected to the output port of the AND circuit 125, and a source connected to the output terminal 111 and the drain of the switch 127. The switch 127 contains a source connected to the ground terminal 102.

The operation of the voltage output circuit 100 is now described.

The power terminal 101 supplies a predetermined power voltage. The ground terminal 102 provides a power voltage different from that of the power terminal 101, and as an example of a reference power voltage for circuit operation, it supplies a power voltage of 0V (zero volt) (hereinafter referred to as "ground voltage").

The level shift circuit 120 level-shifts the signal VPWM received by the input terminal 110 and outputs the signal HS_DRV from the output port. Generally, in response to the switch 126 being an NMOS transistor, the level shift circuit 120 is added because it is necessary to make the gate voltage higher than the power voltage when turning it on. Further, the level shift circuit 120 is designed to be capable of performing level shift operations relatively quickly regardless of the transition direction of the signal VPWM (from high level to low level, or vice versa). The inverter 122 inverts the received signal VPWM and outputs the signal LS_DRV.

The delay circuit 130 (more specifically, the delay element 131) adds a predetermined delay time to the received signal LS_DRV and outputs the signal LS_GATE. Here, the predetermined delay time in the delay circuit 130 is set to be longer than the delay time of the level shift circuit 120.

The switch 127 performs on-off operation according to the signal LS_GATE received by the gate. The inverter 124 inverts the received signal LS_GATE and outputs the signal LS_B1. The level shift circuit 121 level-shifts the received signal LS_B1 and outputs the signal LS_B2. The level shift circuit 121 is designed so that only one of the transition directions of the signal received by the level shift circuit 120 (from high level to low level, or vice versa) performs level shift operation several times faster than the other direction. This is achieved by simplifying the circuit by limiting the increase of the operating speed to one transition direction, thereby reducing the parasitic capacitance within the circuit.

The AND circuit 125 outputs the signal HS_GATE from the logical product of the two received signals HS_DRV and LS_B2. The switch 126 performs on-off operation according to the signal HS_GATE received by the gate. The voltage of the signal VSW at the output terminal 111 becomes the power voltage in response to the switch 126 being on, and becomes 0V in response to the switch 127 being on.

The signal levels of the aforementioned signals and their voltages is now defined. The signals VPWM, LS_DRV, LS_GATE, and LS_B1 are defined with a low level of 0V and a high level of 5V. The signals HS_DRV, LS_B2, and HS_GATE, which are level-shifted by the level shift circuit 120 or the level shift circuit 121, are defined with a low level at the voltage VSW of the output terminal 111, and a high level at the voltage VSW+5V. In either case, the voltage difference between the high level and the low level is 5V.

To describe the characteristic configuration of the output control circuit 10 and the voltage output circuit 100 of this embodiment, the circuit operation of the output control circuit 10 and the voltage output circuit 100 is described in detail below.

Figure 2:
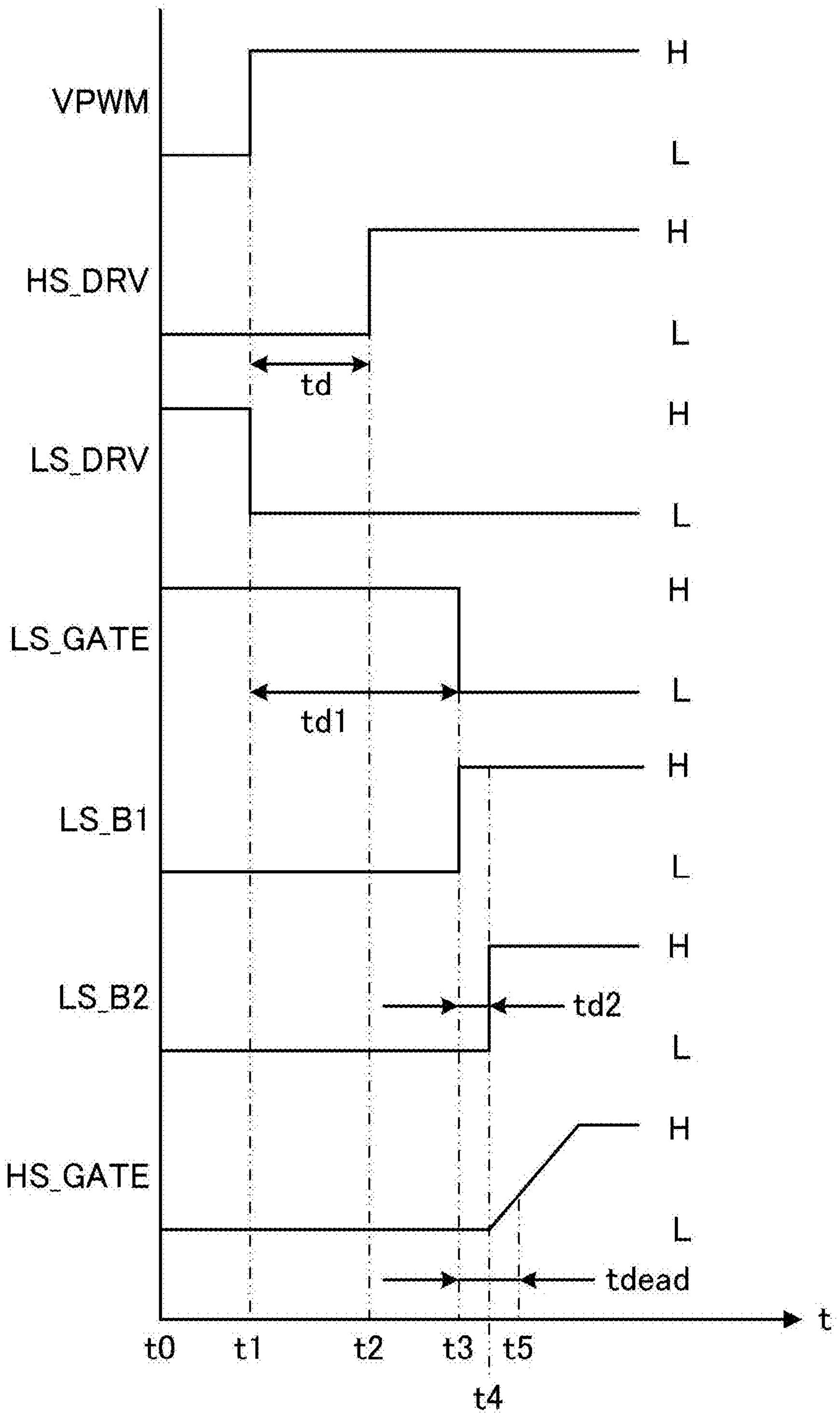
FIG. 2 is a diagram illustrating signal waveforms at various nodes of the output control circuit according to the first embodiment.

FIG. 2 illustrates the waveforms of signals VPWM, HS_DRV, LS_DRV, LS_GATE, LS_B1, LS_B2, and HS_GATE in the voltage output circuit 100. Although the absolute levels of these signals differ as described above, the voltage difference between their respective high levels (indicated as "H" in the figures including FIG. 2) and low levels (indicated as "L" in the figures including FIG. 2) is equal. Each waveform is illustrated with reference to the low level voltage.

At time to, the signal VPWM is at a low level (0V). At this time, the signal level of the signal HS_DRV output from the level shift circuit 120 is at a low level (VSW). Since the signal level of the signal HS_DRV supplied to the first input port is at a low level (VSW), the AND circuit 125 outputs the signal HS_GATE with a signal level at a low level (VSW). Since the gate-source voltage of the switch 126 is 0V, the switch 126 is off.

Since the received signal VPWM is at a low level (0V), the inverter 122 outputs a high level (5V) signal LS_DRV. Since the signal level of the received signal LS_DRV is at a high level (5V), the delay element 131 outputs a high level (5V) signal LS_GATE. Since the gate-source voltage corresponds to the high level of the signal LS_GATE, which is 5V, the switch 127 is on.

From time t1 to t2, as the signal VPWM transitions from a low level (0V) to a high level (5V), the output signal HS_DRV of the level shift circuit 120 transitions from a low level (VSW) to a high level (VSW+5V). At this time, the signal HS_DRV transitions with a delay time td included in the level shift circuit 120 added to the signal VPWM. It is noted that this delay time td is generated by the parasitic capacitance included in the level shift circuit 120, and is a value that cannot be ignored in relation to the expected value of the dead time.

The inverter 122 transitions the output signal LS_DRV from a high level (5V) to a low level (0V). The delay element 131 operates to transition the output signal LS_GATE by adding a delay time td1 included in the delay element 131 in response to the transition of the input signal LS_DRV. It is noted that at this point, since the delay time td1 has not elapsed, the signal LS_GATE continues to be at a high level (5V). Among the signals in the subsequent stages of the delay element 131, other signals LS_B1, LS_B2, and HS_GATE, excluding the aforementioned signal LS_GATE, also continue in the same state as at time to.

At time t3, after the delay time td0 has elapsed, the signal LS_GATE transitions from a high level (5V) to a low level (0V). The switch 127 transitions from on to off as the gate-source voltage falls below the threshold. The inverter 124, in response to the transition of the received signal LS_GATE, transitions the output signal LS_B1 from a low level (0V) to a high level (5V).

At time t4, the level shift circuit 121 level-shifts the received signal LS_B1 and transitions the output signal LS_B2 from a low level (VSW) to a high level (VSW+5V). At this time, the signal LS_B2 transitions with the delay time td2 included in the level shift circuit 121 added to the signal LS_B1. Here, it is assumed that the operation of transitioning from a low level to a high level in the level shift circuit 121 is accelerated. In other words, the relationship between the delay time td of the level shift circuit 120 and the delay time td2 of the level shift circuit 121 is td>>td2.

Since signal levels of two received signals become high level (VSW+5V), the AND circuit 125 transitions its output signal HS_GATE to a high level (VSW+5V). Here, the rise of the signal HS_GATE is gradual (with a long rise time) due to the output resistance of the AND circuit 125 and the gate capacitance of the switch 126.

At time t5, in response to the signal HS_GATE exceeding the threshold of the switch 126, the switch 126 transitions from off to on.

According to the above-described operation, in the output control circuit 10 and the voltage output circuit 100 including the output control circuit 10, during the period from time t3 to time t5, both switch 126 and switch 127 are off, generating a dead time tdead.

According to the output control circuit 10 and the voltage output circuit 100, by setting the delay time td1 of the delay element 131 longer than the delay time td of the level shift circuit 120 to extend the period during which the switch 127 is on, and by applying the level shift circuit 121 that operates faster than the level shift circuit 120, it is possible to eliminate the limitation imposed by the delay time td on the minimum value of the dead time tdead. Thus, the dead time tdead may be shortened while the level shift circuit 120 or 121 exists in the stage preceding the switch 126 or in the path of its control signal.

Second Embodiment

Figure 3:
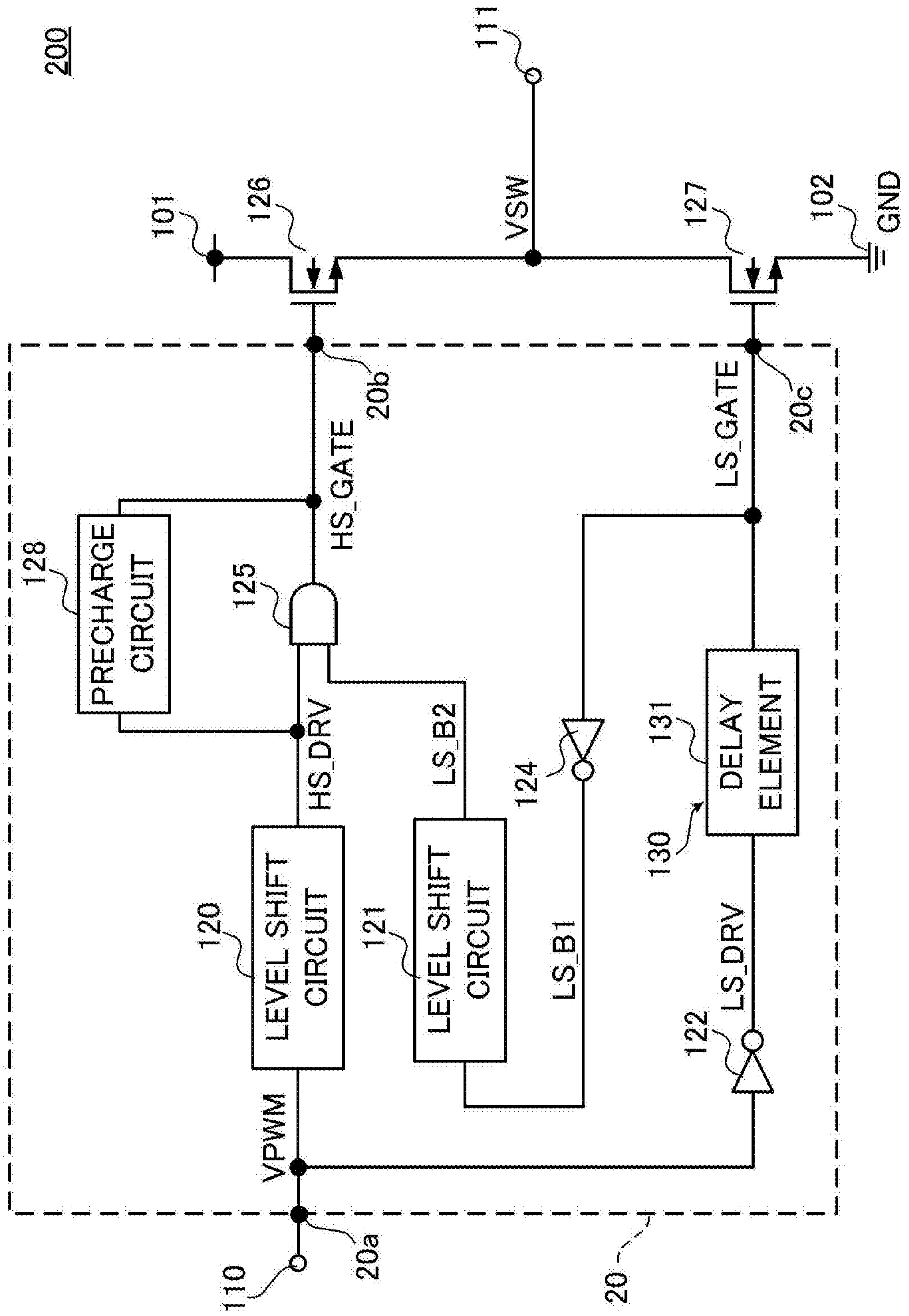
FIG. 3 is a circuit diagram illustrating a configuration example of an output control circuit and a voltage output circuit according to the second embodiment of the present invention.

FIG. 3 is a circuit diagram of an output control circuit 20 and a voltage output circuit 200 serving as examples of the output control circuit and the voltage output circuit, respectively, according to the second embodiment of the present invention.

The voltage output circuit 200 differs from the voltage output circuit 100 in that it includes the output control circuit 20, which further includes a precharge circuit 128 instead of the output control circuit 10, but is substantially the same in other aspects. Thus, in the description of this embodiment, the different precharge circuit 128 is mainly described, and for the components that overlap with the voltage output circuit 100, the same reference numerals are used and their descriptions are omitted.

The voltage output circuit 200 includes, for example, a power terminal 101, a ground terminal 102, an output control circuit 20, a switch 126, a switch 127, an input terminal 110, and an output terminal 111. The output control circuit 20, in addition to the components of the output control circuit 10, further includes a precharge circuit 128. Further, the output control circuit 20 includes an input port 20*a* connected to the input terminal 110, a first output port 20*b* connected to the control port of the switch 126, and a second output port 20*c*.

The precharge circuit 128 includes an input port connected to the first input port of the AND circuit 125 and an output port connected to the output port of the AND circuit 125.

Next, the operation of the output control circuit 20 and the voltage output circuit 200 are described. It is noted that, operations that are substantially the same as those of the output control circuit 10 and the voltage output circuit 100 are described in a simplified manner.

In the case where the signal level of the received signal HS_DRV is at a low level (VSW), the output impedance of the precharge circuit 128 becomes a high impedance state. In the case where the signal level of the signal HS_DRV is at a high level (VSW+5V), the precharge circuit 128 outputs a signal HS_GATE with a predetermined voltage lower than the threshold of the switch 126 from the output port.

Figure 4:
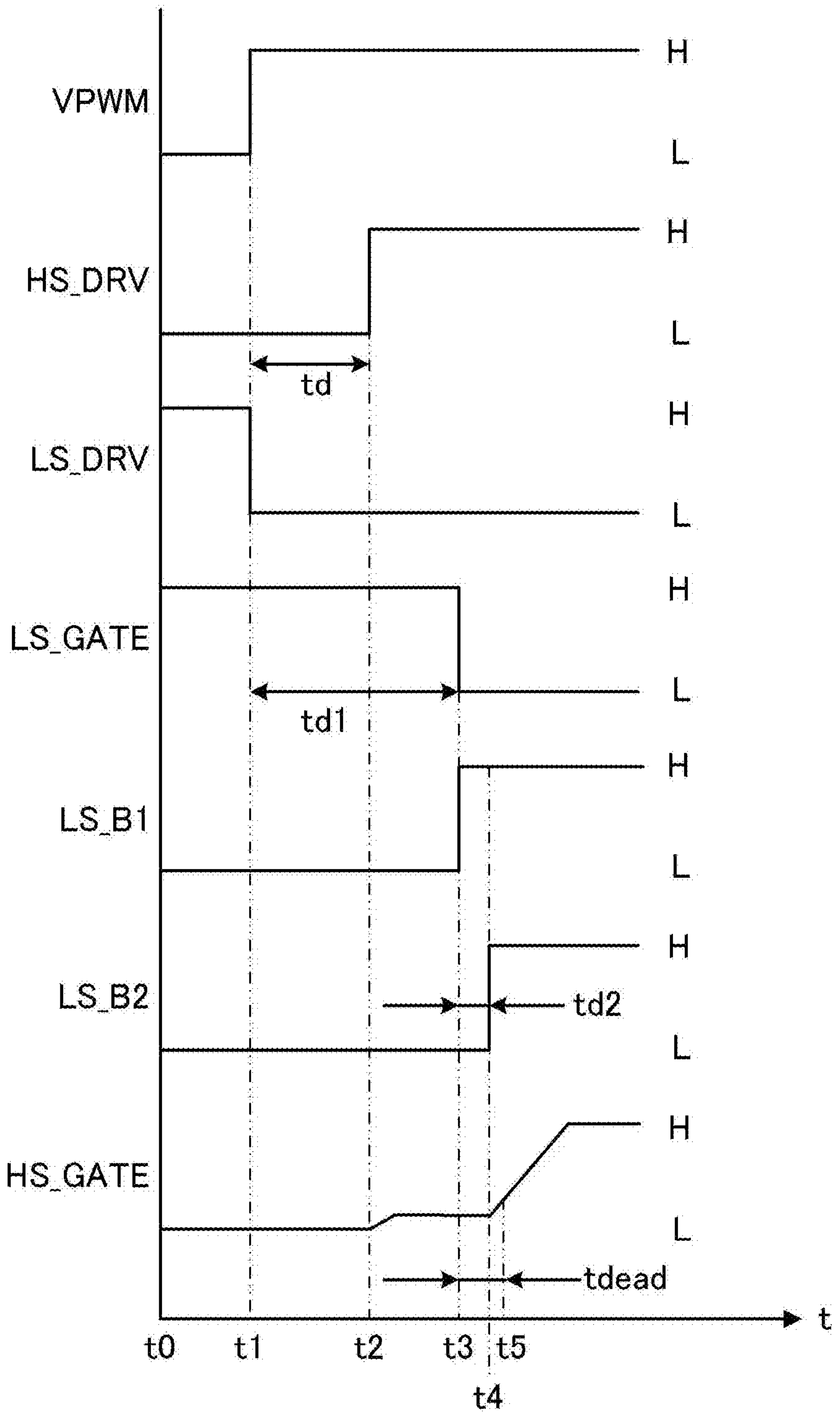
FIG. 4 is a diagram illustrating signal waveforms at various nodes of the output control circuit according to the second embodiment.

FIG. 4 illustrates the waveforms of signals VPWM, HS_DRV, LS_DRV, LS_GATE, LS_B1, LS_B2, and HS_GATE in the voltage output circuit 200. Although the absolute levels of these signals differ from those in FIG. 2 as described earlier, the voltage differences between their respective high levels and low levels are equal. In this figure as well, the waveforms of signals VPWM, HS_DRV, LS_DRV, LS_GATE, LS_B1, LS_B2, and HS_GATE are illustrated with the low level voltage as a reference.

At time t2, in response to the signal level of HS_DRV transitioning from low level (VSW) to high level (VSW+5V), the precharge circuit 128 outputs a signal HS_GATE with a predetermined voltage lower than the threshold of the switch 126 from the output port to precharge. Here, the rise of the signal HS_GATE is gradual due to the output resistance of the precharge circuit 128 and the gate capacitance of the switch 126.

In the period from time t2 to time t5 (t2<t<t5), the voltage output circuit 200 operates similarly to the voltage output circuit 100. However, in the period from time t2 to t3 (t2<t<t3), the voltage of the signal HS_GATE in the voltage output circuit 200 is higher than the voltage of the signal HS_GATE in the voltage output circuit 100 by the precharge amount, and thus the period from time t4 to time t5 is shorter than the period from time t4 to time t5 in the voltage output circuit 100. At time t5, in response to the signal HS_GATE exceeding the threshold of the switch 126, the switch 126 transitions from off to on.

By the operation described above, in the output control circuit 20 and the voltage output circuit 200, a dead time tdead is generated from time t3 to time t5, during which both switch 126 and switch 127 are off.

Further, in the output control circuit 20 and the voltage output circuit 200, since the voltage of the signal HS_GATE is precharged at time t4, the voltage difference between the voltage of the signal HS_GATE and the threshold of the switch 126 is smaller compared to the case without precharging. Thus, the time from time t4 to time t5 for the signal HS_GATE to exceed the threshold of the switch 126 is shortened compared to the time for the signal HS_GATE to exceed the threshold of the switch 126 in the case without precharging.

According to the output control circuit 20 and the voltage output circuit 200, by setting the delay time td1 of the delay element 131 longer than the delay time td of the level shift circuit 120 to extend the period during which the switch 127 is on, and by applying the level shift circuit 121 that operates faster than the level shift circuit 120, it is possible to eliminate the limitation imposed by the delay time td on the minimum value of the dead time tdead. Thus, the dead time tdead may be shortened while the level shift circuit 120 or 121 exists in the stage preceding the switch 126 or in the path of its control signal.

Further, according to the output control circuit 20 and the voltage output circuit 200, by adding the precharge circuit 128, the dead time tdead may be further shortened compared to the case without the precharge circuit 128.

Third Embodiment

Figure 5:
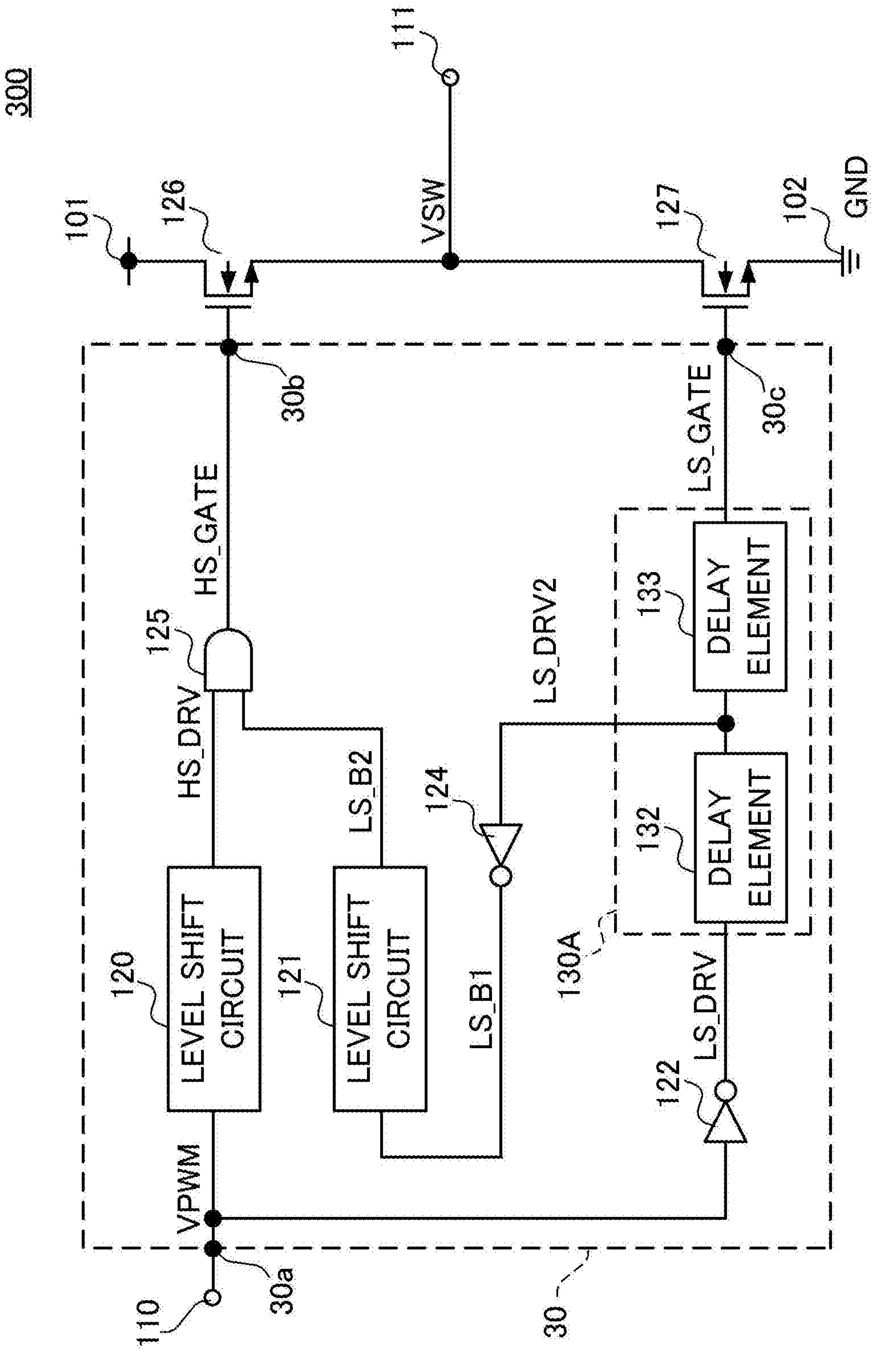
FIG. 5 is a circuit diagram illustrating a configuration example of an output control circuit and a voltage output circuit according to the third embodiment of the present invention.

FIG. 5 is a circuit diagram of an output control circuit 30 and a voltage output circuit 300, which are first examples of the output control circuit and the voltage output circuit, respectively, according to the third embodiment of the present invention.

The output control circuit 30 and the voltage output circuit 300 differ from the output control circuit 10 and the voltage output circuit 100 in that they include a delay circuit 130A including delay element 132 and delay element 133, which are configured by dividing the delay element 131 into multiple elements, for example, two elements, instead of the delay circuit 130, but in other aspects, they do not substantially differ. Thus, in the description of this embodiment, the different delay circuit 130A, delay element 132, and delay element 133 are mainly described, while descriptions for the components that overlap with the output control circuit 10 and the voltage output circuit 100 are omitted by assigning the same reference numerals.

The voltage output circuit 300 includes, for example, a power terminal 101, a ground terminal 102, an output control circuit 30, a switch 126, a switch 127, an input terminal 110, and an output terminal 111. The output control circuit 30, compared to the output control circuit 10, includes a delay circuit 130A including delay element 132 and delay element 133 instead of the delay circuit 130. Further, the output control circuit 30 includes an input port 30*a* connected to the input terminal 110, a first output port 30*b* connected to the control port of the switch 126, and a second output port 30*c* connected to the control port of the switch 127.

The delay circuit 130A, compared to the delay circuit 130, is configured to include not only the first output port but also a second output port connected to the input port of the level shift circuit 121 through the inverter 124. In other words, while the delay circuit 130 is a single-input single-output type that outputs one output signal for one input signal, the delay circuit 130A is configured as a single-input dual-output type that outputs two different output signals for one input signal. The delay element 132 contains an input port connected to the input terminal 110 through the inverter 122 and an output port connected to the input port of the level shift circuit 121, which is the second output port of the delay circuit 130A, through the inverter 124. The delay element 133 contains an input port connected to the output port of the delay element 132, while its output port, which is a node identical to the second output port 30*c*, is connected to the gate of the switch 127. In this way, the delay circuit 130A is configured by connecting the delay element 132 and the delay element 133 in series.

Next, the operation of the output control circuit 30 and the voltage output circuit 300 are described. It is noted that, operations that are substantially the same as those of the output control circuit 10 and the voltage output circuit 100 are described in a simplified manner.

The delay element 132 adds a delay time td3 to the received signal LS_DRV and outputs the signal LS_DRV2 to the input port of the level shift circuit 121 through the inverter 124. The delay element 133 adds a delay time td4 to the received signal LS_DRV2 and outputs the signal LS_GATE to the gate of the switch 127 via the second output port 30*c*.

Figure 6:
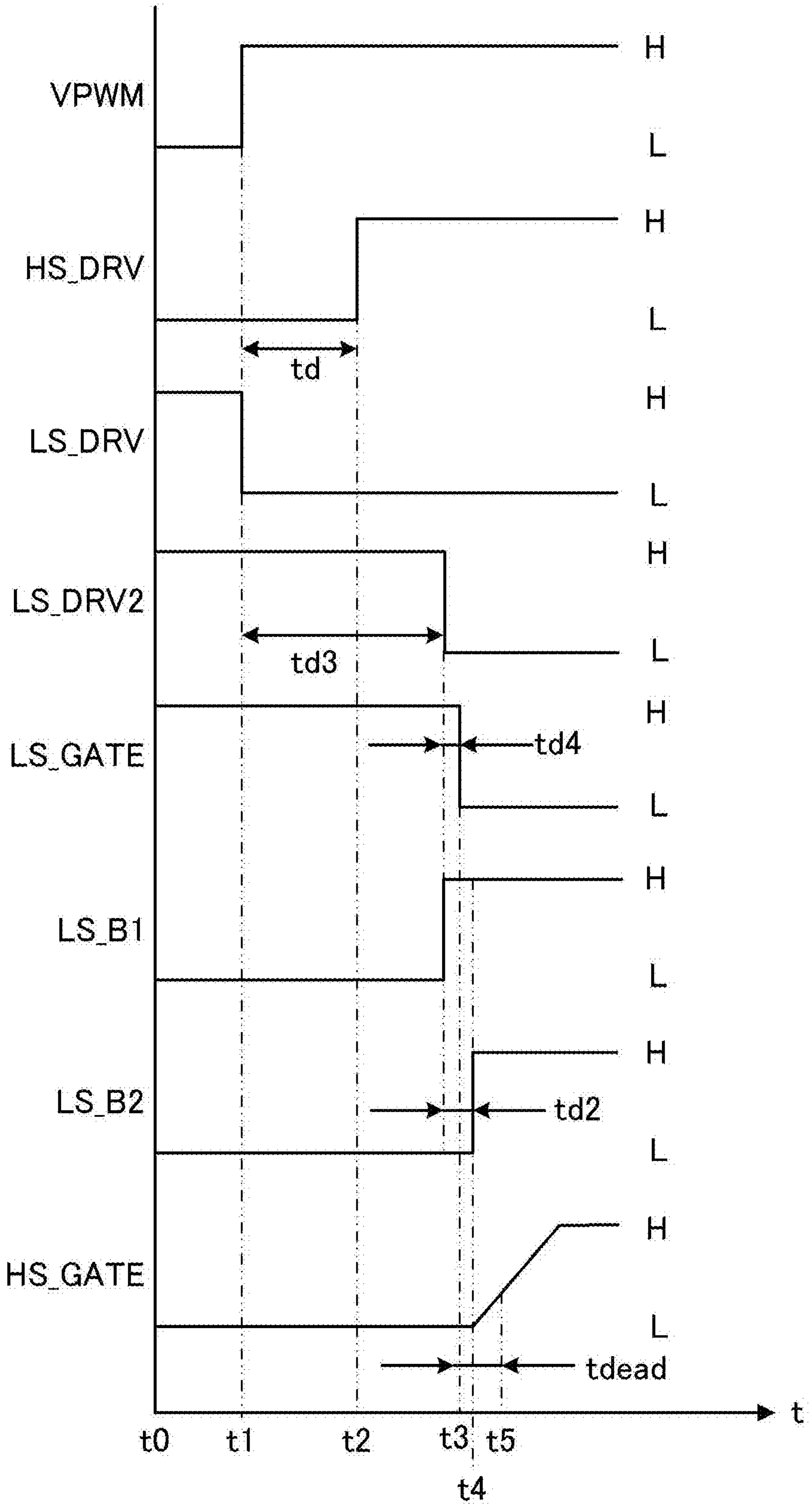
FIG. 6 is a diagram illustrating signal waveforms at various nodes of the output control circuit according to the third embodiment.

FIG. 6 illustrates the waveforms of signals VPWM, HS_DRV, LS_DRV, LS_GATE, LS_B1, LS_B2, and HS_GATE in the voltage output circuit 300. Although the absolute levels of these signals differ from those in FIG. 2 as described earlier, the voltage differences between their respective high levels and low levels are equal. In this figure as well, the waveforms of signals VPWM, HS_DRV, LS_DRV, LS_GATE, LS_B1, LS_B2, and HS_GATE are illustrated with the low level voltage as a reference.

At time t1, in response to the signal level of signal LS_DRV transitioning from high level (5V) to low level (0V), the delay element 132 operates to transition the signal level of the output signal LS_DRV2 after the delay time td3 has elapsed in response to the transition of the signal level of the received signal LS_DRV. At this point, since the delay time td3 has not yet elapsed, the signal LS_DRV2 continues to maintain its high level (5V) signal level. Among the signals in the subsequent stages of the delay element 132, other signals LG_GATE, LS_B1, LS_B2, and HS_GATE, excluding the aforementioned signal LS_DRV2, also continue in the same state as at time t0.

After the delay time td3 has elapsed from time t1, the signal LS_DRV2 transitions from high level (5V) to low level (0V). The inverter 124 transitions the output signal LS_B1 from low level (0V) to high level (5V). At this time, the level shift circuit 121 operates to transition the signal level of the output signal LS_B2 after the delay time td2 has elapsed in response to the transition of the signal level of the received signal LS_B1. At this point, since the delay time td2 has not yet elapsed, the signal LS_B2 continues to maintain its low level (VSW). The signal HG_GATE, which is downstream of the level shift circuit 121, also continues in the same state as at time t0.

The delay element 133 operates to transition the signal level of the output signal LS_GATE after the delay time td4 has elapsed in response to the transition of the signal level of the received signal LS_DRV2. At this point, since the delay time td4 has not yet elapsed, the signal LS_GATE continues to maintain its high level (5V).

At time t3, the signal LS_GATE transitions from high level (5V) to low level (0V) after the delay time td4 of the delay element 133 has elapsed. In response to the signal LS_GATE transitioning to low level (0V), the gate voltage of the switch 127 falls below the threshold, and the switch 127 turns off.

At time t4, the level shift circuit 121 level-shifts the received signal LS_B1 and transitions the output signal LS_B2 from a low level (VSW) to a high level (VSW+5V). At this time, the signal LS_B2 transitions with the delay time td2 included in the level shift circuit 121 added to the signal LS_B1.

As mentioned earlier, the operation of the level shift circuit 121 at this time is accelerated, and the relationship between the delay time td of the level shift circuit 120 and the delay time td2 of the level shift circuit 121 is td>>td2. At time t4, since both the first input port and the second input port of the AND circuit 125 become high level (VSW+5V), the AND circuit 125 transitions the output signal HS_GATE from low level (VSW) to high level (VSW+5V). Here, the rise of the signal HS_GATE is gradual due to the output resistance of the AND circuit 125 and the gate capacitance of the switch 126.

At time t5, in response to the signal HS_GATE exceeding the threshold of the switch 126, the switch 126 transitions from off to on.

By the operation described above, in the output control circuit 30 and the voltage output circuit 300, a dead time tdead is generated from time t3 to time t5, during which both switch 126 and switch 127 are off.

Further, in the output control circuit 30 and the voltage output circuit 300, by transitioning the signal LS_B1 received by the level shift circuit 121 from low level (0V) to high level (5V) before the switch 126 turns off at time t3, the difference between time t3 and time t4 is shortened compared to the difference between time t3 and time t4 in the output control circuit 10 and the voltage output circuit 100. As a result, the limitation imposed by the delay time td2 of the level shift circuit 121 on the minimum value of the dead time tdead may be reduced.

According to the output control circuit 30 and the voltage output circuit 300, by setting the total delay time td3+td4 of the delay element 132 and the delay element 133 to be longer than the delay time td of the level shift circuit 120 to extend the period during which the switch 127 is on, and by using the level shift circuit 121 that operates faster than the level shift circuit 120, the limitation imposed by the delay time td of the level shift circuit 120 on the minimum value of the dead time tdead may be eliminated. Furthermore, by transitioning the signal LS_B1 received by the level shift circuit 121 before the switch 127 turns off, the limitation imposed by the delay time td2 of the level shift circuit 121 on the minimum value of the dead time tdead may be reduced. Thus, it is possible to shorten the dead time while including a level shift circuit exist in the stage preceding the high-side switch or in the path of its control signal.

It is noted that the present invention is not limited to the above-described embodiments as they are, and in the implementation stage, it is possible to implement it in various forms other than the above-described embodiments, and various omissions, additions, replacements, or modifications may be made without departing from the scope of the present invention. For example, the output control circuit and the voltage output circuit according to this embodiment may be configured as illustrated in FIG. 7 described later.

Figure 7:
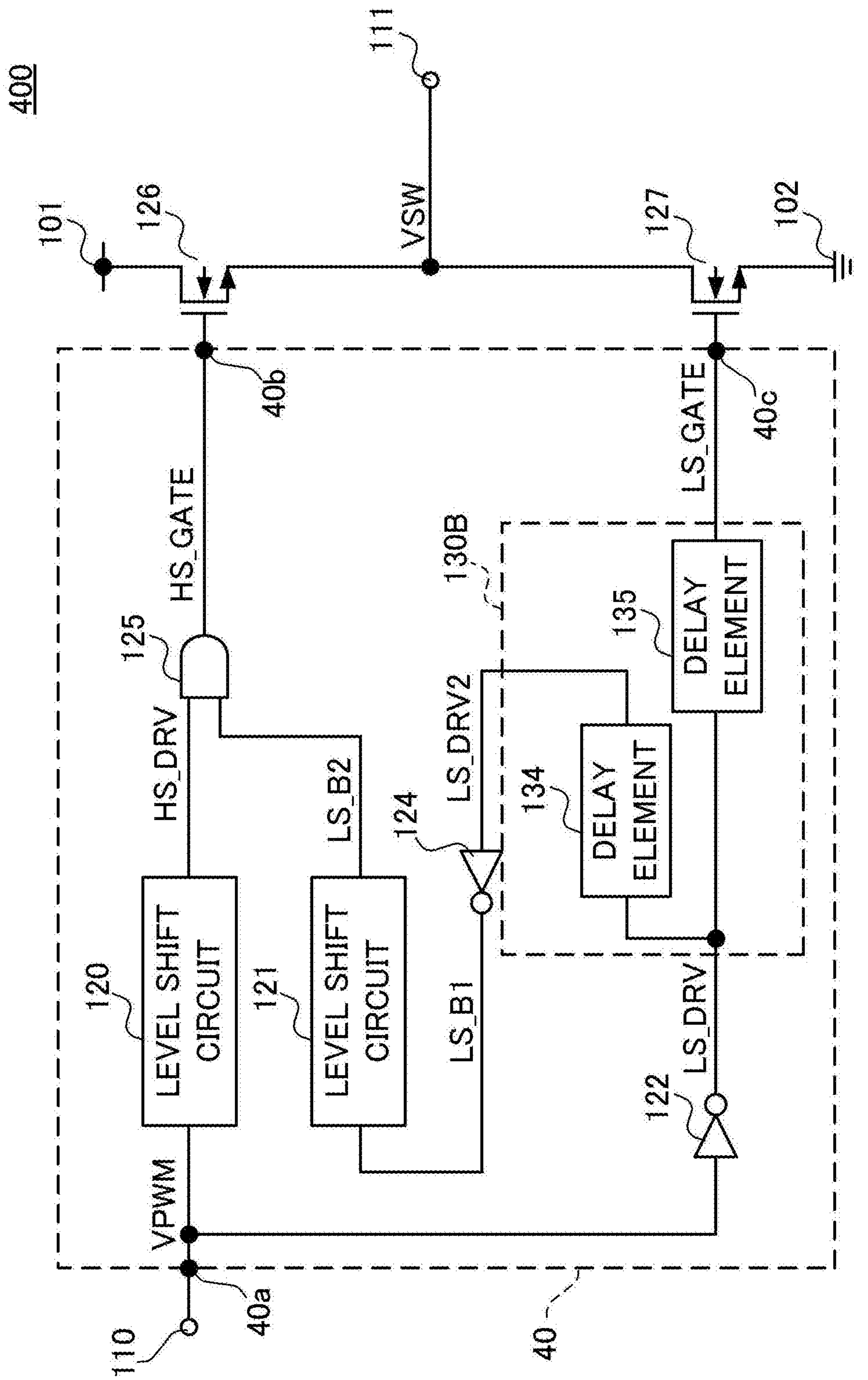
FIG. 7 is a circuit diagram illustrating another configuration example of an output control circuit and a voltage output circuit according to the third embodiment.

FIG. 7 is a circuit diagram of an output control circuit 40 and a voltage output circuit 400, which are modification examples (second examples) of the output control circuit and the voltage output circuit, respectively, according to the third embodiment.

The output control circuit and the voltage output circuit according to this embodiment may be configured, for example, as the output control circuit 40 and the voltage output circuit 400 including a delay circuit 130B instead of the delay circuit 130A in the output control circuit 30 and the voltage output circuit 300 (FIG. 5), as illustrated in FIG. 7.

The voltage output circuit 400 includes, for example, a power terminal 101, a ground terminal 102, an output control circuit 40, a switch 126, a switch 127, an input terminal 110, and an output terminal 111. The output control circuit 40 includes a delay circuit 130B including a delay element 134 and a delay element 135 instead of the delay circuit 130A in the output control circuit 30. Further, the output control circuit 40 includes an input port 40*a* connected to the input terminal 110, a first output port 40*b* connected to the control port of the switch 126, and a second output port 40*c* connected to the control port of the switch 127.

The delay circuit 130B includes an input port connected to the input terminal 110 via the inverter 122, a first output port connected to the control port of the switch 127, and a second output port connected to the input port of the level shift circuit 121, and it further includes a delay element 134 and a delay element 135. The delay element 134 includes an input port that is a node identical to the input port of the delay circuit 130B and an output port that is a node identical to the second output port of the delay circuit 130B. The delay element 135 includes an input port connected to the input port of the delay element 134 and an output port that is a node identical to the first output port of the delay circuit 130B. In other words, the delay circuit 130B is configured by connecting the delay element 134 and the delay element 135 in parallel.

The delay element 134 is configured to add a delay time td3 to the received signal LS_DRV and output the signal LS_DRV2 to the input port of the level shift circuit 121 via the inverter 124. The delay element 135 is configured to add a delay time td3+td4 to the received signal LS_DRV and output the signal LS_GATE to the gate of the switch 127 via the second output port 40*c* connected to the gate of the switch 127.

The output control circuit 40 and the voltage output circuit 400 configured in this manner may provide similar effects to those of the output control circuit 30 and the voltage output circuit 300. In other words, the output control circuit 40 and the voltage output circuit 400 may eliminate the limitation that the delay time td of the level shift circuit 120 imposes on the minimum value of the dead time tdead by setting the delay time td3+td4 of the delay element 135 to be longer than the delay time td of the level shift circuit 120 to extend the period during which the switch 127 is on, and by using the level shift circuit 121 that operates faster than the level shift circuit 120.

Further, by setting the delay time td3 of the delay element 134 to be shorter than the delay time td3+td4 of the delay element 135, and by transitioning the signal LS_B1 received by the level shift circuit 121 from low level (0V) to high level (5V) before the switch 127 turns off, it is possible to reduce the limitation that the delay time td2 of the level shift circuit 121 imposes on the minimum value of the dead time tdead. Thus, it is possible to shorten the dead time while including a level shift circuit exist in the stage preceding the high-side switch or in the path of its control signal.

It is noted that the application of the voltage output circuit and the output control circuit according to this embodiment is not limited to the voltage output circuits 100, 200, 300, and 400 described above. The voltage output circuit and the output control circuit according to this embodiment may be applied to any voltage output circuit that outputs a voltage based on the voltage VSW at the connection point of the switch 126 and the switch 127 connected in series, either directly or via a circuit element or circuit.

Further, while the output control circuit 20 and the voltage output circuit 200 described above include the precharge circuit 128 in addition to the output control circuit 10, it is not limited to this example. The output control circuit 20 may further include the precharge circuit 128 in addition to the output control circuit 30 or the output control circuit 40. In other words, the output control circuit 30 and the voltage output circuit 300 may include the delay circuit 130A instead of the delay circuit 130 in comparison to the output control circuit 20 and the voltage output circuit 200, and the output control circuit 40 and the voltage output circuit 400 may include the delay circuit 130B instead of the delay circuit 130 in comparison to the output control circuit 20 and the voltage output circuit 200.

These embodiments and modifications thereof are included in the scope and spirit of the invention, and are included within the scope of the invention described in the claims and equivalents thereof.

What is claimed is:

1. An output control circuit, comprising:
- a first output terminal, connected to a control port of a first switch of a switch circuit configured by connecting in series the first switch and a second switch including control ports;
- a second output terminal, connected to a control port of the second switch;
- an input terminal;
- a first level shift circuit, comprising an input port connected to the input terminal and an output port level-shifting a signal received by the input port and outputting a level-shifted signal;
- a delay circuit, comprising an input port connected to the input terminal and a first output port connected to the second output terminal, the delay circuit outputting a signal received from the input port after a delay time set longer than a delay time of the first level shift circuit;
- a second level shift circuit, comprising an input port connected to an output port of the delay circuit and an output port level-shifting a signal received by the input port and outputting a level-shifted signal; and
- a control circuit, comprising a first input port connected to an output port of the first level shift circuit, a second input port connected to an output port of the second level shift circuit, and an output port connected to the first output terminal, the control circuit outputting a signal with a signal level determined to be either a first level or a second level based on signal levels of a signal received from the first input port and a signal received from the second input port,
- wherein the signal output from the control circuit is transmitted to the first output terminal while maintaining the determined signal level.

2. The output control circuit according to claim 1, wherein the second level shift circuit is configured to have a higher operating speed than an operating speed of the first level shift circuit.

3. The output control circuit according to claim 1, wherein the second level shift circuit is configured to have a higher speed for transitioning from a second signal level to a first signal level compared to a speed for transitioning from the first signal level to the second signal level of a signal output from an output port of the second level shift circuit.

4. The output control circuit according to claim 1, wherein the delay circuit comprises a delay element comprising an input port connected to the input terminal and an output port connected to the second output terminal.

5. The output control circuit according to claim 1, wherein the delay circuit comprises a second output port connected to an input port of the second level shift circuit, and the delay circuit comprises:
- a first delay element, comprising an input port that is a node identical to an input port of the delay circuit and an output port that is a node identical to the second output port of the delay circuit; and
- a second delay element, comprising an input port connected to an output port of the first delay element and an output port that is a node identical to the first output port of the delay circuit.

6. The output control circuit according to claim 1, wherein the delay circuit comprises a second output port connected to an input port of the second level shift circuit, and the delay circuit comprises:
- a first delay element, comprising an input port that is a node identical to an input port of the delay circuit and an output port that is a node identical to the second output port of the delay circuit; and
- a second delay element, comprising an input port connected to an input port of the first delay element and an output port that is a node identical to the first output port of the delay circuit.

7. The output control circuit according to claim 1, further comprising:
- a precharge circuit comprising an input port connected to a first input port of the control circuit and an output port connected to an output port of the control circuit.

8. A voltage output circuit, comprising:
- the output control circuit according to claim 1;
- an input terminal, connected to an input terminal of the output control circuit;
- the first switch;
- the second switch; and
- an output terminal, connected to a connection point between the first switch and the second switch.

9. An output control circuit, comprising:
- a first output terminal, connected to a control port of a first switch of a switch circuit configured by connecting in series the first switch and a second switch including control ports;
- a second output terminal, connected to a control port of the second switch;
- an input terminal;
- a first level shift circuit, comprising an input port connected to the input terminal and an output port level-shifting a signal received by the input port and outputting a level-shifted signal;
- a delay circuit, comprising an input port connected to the input terminal, a first output port connected to the second output terminal, and a second output port, the delay circuit outputting a signal received from the input port after a delay time set longer than a delay time of the first level shift circuit;
- a second level shift circuit, comprising an input port connected to the second output port of the delay circuit and an output port level-shifting a signal received by the input port and outputting a level-shifted signal; and
- a control circuit, comprising a first input port connected to an output port of the first level shift circuit, a second input port connected to an output port of the second level shift circuit, and an output port connected to the first output terminal, the control circuit outputting a signal with a signal level determined to be either a first level or a second level based on signal levels of a signal received from the first input port and a signal received from the second input port.

10. The output control circuit according to claim 9, wherein the delay circuit comprises:
- a first delay element, comprising an input port that is a node identical to an input port of the delay circuit and an output port that is a node identical to the second output port of the delay circuit; and
- a second delay element, comprising an input port connected to an output port of the first delay element and an output port that is a node identical to the first output port of the delay circuit.

11. The output control circuit according to claim 9, wherein the delay circuit comprises:

a first delay element, comprising an input port that is a node identical to an input port of the delay circuit and an output port that is a node identical to the second output port of the delay circuit; and a second delay element, comprising an input port connected to an input port of the first delay element and an output port that is a node identical to the first output port of the delay circuit.

12. The output control circuit according to claim 7, wherein the precharge circuit is configured to:

become a high impedance state when a signal level of a signal output from the first level shift circuit is at a first level; and output a signal with a predetermined voltage lower than a threshold voltage of the first switch from the output port when the signal level of the signal output from the first level shift circuit is at a second level.

* * * * *